(12) United States Patent
Assadi

(10) Patent No.: US 7,129,982 B1
(45) Date of Patent: Oct. 31, 2006

(54) COLOR IMAGE SENSOR WITH INTEGRATED BINARY OPTICAL ELEMENTS

(75) Inventor: Azar Assadi, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,487

(22) Filed: Dec. 30, 1999

(51) Int. Cl.
*H04N 9/07* (2006.01)

(52) U.S. Cl. ........................... 348/336; 348/272

(58) Field of Classification Search ............... 348/294, 348/272, 273, 310, 336, 340; 257/231, 233, 257/291, 292, 432; 250/208.1
See application file for complete search history.

(56) References Cited

U.S. PATENT DOCUMENTS

| | | | | |
|---|---|---|---|---|
| 4,667,092 A | * | 5/1987 | Ishihara | 250/216 |
| 4,970,381 A | * | 11/1990 | Huang et al. | 250/208.1 |
| 5,056,894 A | * | 10/1991 | Kuijk et al. | 349/50 |
| 5,258,024 A | * | 11/1993 | Chavel et al. | 623/5.16 |
| 5,321,297 A | * | 6/1994 | Enomoto | 257/432 |
| 5,323,052 A | * | 6/1994 | Koyama | 257/232 |
| 5,371,397 A | * | 12/1994 | Maegawa et al. | 257/432 |
| 5,408,343 A | * | 4/1995 | Sugiura et al. | 358/520 |
| 5,514,888 A | * | 5/1996 | Sano et al. | 257/232 |
| 5,517,279 A | * | 5/1996 | Hugle et al. | 355/46 |
| 5,600,486 A | * | 2/1997 | Gal et al. | 359/569 |
| 5,610,390 A | * | 3/1997 | Miyano | 250/216 |
| 5,614,950 A | * | 3/1997 | Park et al. | 348/315 |
| 5,648,874 A | * | 7/1997 | Sawaki et al. | 359/622 |
| 5,672,519 A | * | 9/1997 | Song et al. | 438/69 |
| 5,677,200 A | * | 10/1997 | Park et al. | 438/70 |
| 5,682,203 A | * | 10/1997 | Kato | 348/340 |
| 5,682,265 A | * | 10/1997 | Farn et al. | 359/571 |
| 5,746,797 A | * | 5/1998 | Noda | 65/17.2 |
| 5,760,834 A | * | 6/1998 | Rostoker | 348/340 |
| 5,760,885 A | * | 6/1998 | Yokoyama et al. | 356/4.01 |
| 5,768,023 A | * | 6/1998 | Sawaki et al. | 359/622 |
| 5,871,888 A | * | 2/1999 | Heremans et al. | 430/321 |
| 5,976,680 A | * | 11/1999 | Ikemori et al. | 428/212 |
| 5,976,907 A | * | 11/1999 | Shigeta et al. | 438/65 |
| 6,114,739 A | * | 9/2000 | Theil et al. | 257/458 |
| 6,150,653 A | * | 11/2000 | Assadi et al. | 250/216 |
| 6,163,386 A | * | 12/2000 | Kobayashi et al. | 358/482 |
| 6,194,704 B1 | * | 2/2001 | Assadi et al. | 250/214 R |
| 6,353,228 B1 | * | 3/2002 | Itabashi | 250/370.11 |
| 6,501,065 B1 | * | 12/2002 | Uppal et al. | 250/214.1 |
| 2002/0030890 A1 | * | 3/2002 | Kato et al. | 359/576 |
| 2003/0138988 A1 | * | 7/2003 | Murakami et al. | 438/60 |

FOREIGN PATENT DOCUMENTS

JP        10190943 A    *    7/1998

OTHER PUBLICATIONS

Dictionary onelook.com definition: indium tin oxide.*
Dictionary onelook.com definiton: silica☐☐.*
Encyclopedia: Wikipedia definiton and use of silica.*
Low-temperature sol-gel process developed, Nov. 1997, SPIE Web, OP Reports.*
Binary Optics Veldkamp et al., Scientific American, May 1992, pp. 92-97.*

* cited by examiner

*Primary Examiner*—Tuan Ho
*Assistant Examiner*—Timothy J. Henn
(74) *Attorney, Agent, or Firm*—Blakely, Sokoloff, Taylor & Zafman LLP

(57) ABSTRACT

An integrated pixel sensor structure having a light sensitive diode including a transparent conductor. In addition, a protective layer is also placed over the transparent conductor, the protective layer including a set of diffraction grating elements for producing complementary colors. A system including the integrated pixel sensor structure and post-capture circuitry.

21 Claims, 3 Drawing Sheets

COLOR IMAGE SENSOR WITH INTEGRATED BINARY OPTICAL ELEMENTS

FIELD OF THE INVENTION

This invention relates to imaging devices. More particularly, this invention is directed to a color image sensor with integrated binary optical elements.

BACKGROUND

Many digital video and still image capture systems use a image sensor that is constructed from a complementary metal oxide semiconductor (CMOS) process. CMOS image sensors offer the ability to integrate digital image signal generation circuits directly onto the sensor to achieve a lower system cost. The image sensing portion of a CMOS sensor is constructed of an array of light sensitive elements, each commonly referred to as a "pixel" element. Each pixel element is responsible for capturing one of three color channels: red, green, or blue. Specifically, each pixel element is made sensitive to a certain color channel through the use of a color filter placed over the pixel element such that the light energy reaching the pixel element is due only to the light energy from a particular spectrum. Each pixel element generates a signal that corresponds to the amount of light energy to which it is exposed.

Advances in CMOS processing technology allows the shrinking of the surface area of each pixel element to create higher densities of these light sensors in sensor arrays, thus arriving at sensors with greater resolutions. However, as the numbers of metal layers increases to accommodate the additional circuitry necessary to support the greater number of pixels, thereby so does the vertical heights of pixel elements increase. For example, in a pixel element that has multiple metal layers, the stack height, including the color filter and microlens layers, reaches approximately 10 µm. As light sensitive elements are constructed on the silicon layers underneath the metal layers, light will have to travel on the order of 10 µm from the topmost metal layer to the silicon interface through the opening in the metal layers. As the photosensitive area for a pixel element is reduced, the opening for the pixel element begins to resemble a pinhole. The increased vertical length from the opening to the photosensitive area, coupled with the decrease in opening size, introduces shadowing and interference effects that limit the amount of light incident upon the pixel surface.

The limitation on the range of acceptance angles from which light can incident upon the sensor limits camera performance. Microlenses usually help and produce larger acceptance angle. Using an improved taking lens may improve camera performance, as the taking lens can better channel incident light to strike the sensor at a better angle. Although using a better taking lens may improve camera performance, the increased cost of using an improved taking lens limits the amount of compensation that can be achieved by such use. Thus, it would be desirable to improve light exposure on the sensor without an increase in cost.

SUMMARY OF THE INVENTION

In one embodiment of the present invention, an integrated pixel sensor structure includes a light sensitive diode with a transparent conductor. In addition, a protective layer is placed over the transparent conductor, the protective layer including a set of diffraction grating elements for producing complementary colors.

BRIEF DESCRIPTION OF THE DRAWINGS

The system is illustrated by way of example and not limitation in the figures of the accompanying drawings in which like references indicated similar elements and in which.

DETAILED DESCRIPTION

One possible way to avoid these problems would be to create a diode that resides above the metalization layer. The processing used to create the diode would have to be compatible with silicon processing and fabrication temperatures must remain below the thermal budget of the processes used to place the metal and diffusion layers. For example, the diode creation process should be compatible for complementary metal-oxide semiconductor processes. In addition, a protection layer is used for protecting the diode as the top layer of the diode degrades due to exposure to environmental stresses—especially humidity and heat. A low temperature deposition layer is proposed in order to prevent the degradation of the top layer of micro optics the diode. The same protection layer is used for integrating micro-optics elements for producing color schemes.

Figure 1:
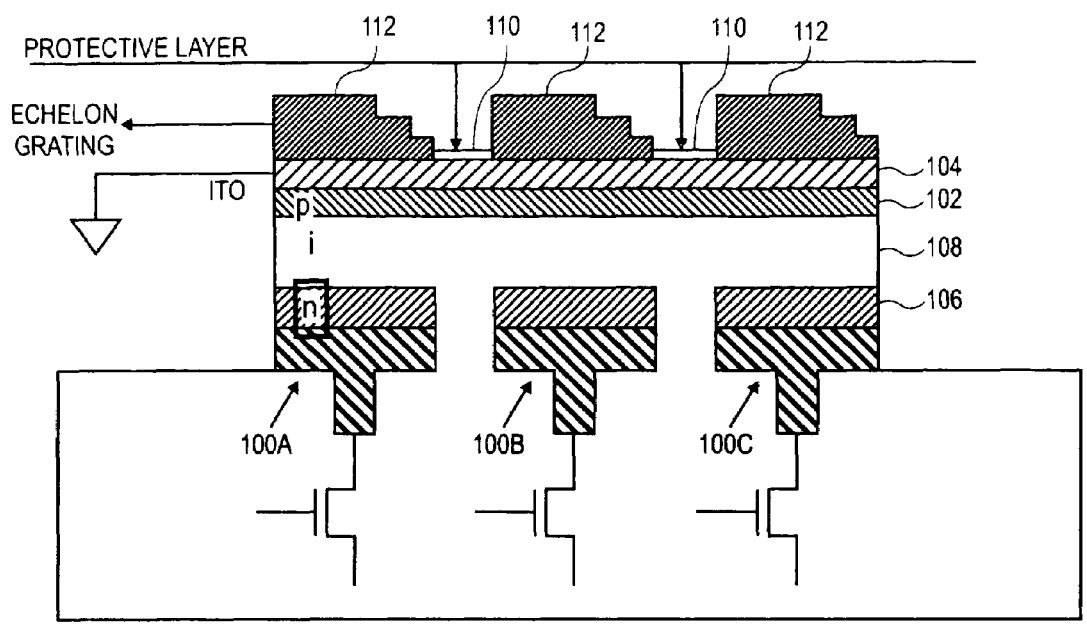
FIG. 1 is a cut-away view of a set of diodes with integrated binary optical elements configured in accordance with one embodiment of the present invention.

The type of diode structure that could be used above the image sensor circuitry is depicted as a set of diodes $100a$–$100c$ in FIG. 1. The diodes could be deposited directly upon the last metalization layer or on aluminum pads deposited on the passivation layer. This diode on top (DOT) structure typically utilizes amorphous silicon as photoactive material. The usual sensor device is an n-i-p device in which the i-layer is about 0.25 to 0.5 µm. thick and the doped n and p layers are approximately 40 nm and 20 nm respectively. The high defect density of the doped a-Si:H makes it insensitive to light as compared to the undoped layer. Thus, the doped layers are present only to provide electrical junctions with low reverse bias leakage current and are made as thin as possible to avoid optical absorption losses.

In FIG. 1, amorphous silicon is deposited from silane gas ($SiH_4$) by plasma-enhanced chemical vapor definition. Films are usually grown at 200–300 C, and virtually any material that can stand the temperature is a suitable substrate. The deposition chambers can be scaled to large sizes. For example, systems handling substrates measuring many square feet have been used to produce solar cells. The a-Si can be doped n or p-type during the deposition through the addition of $PH_3$ or $B_2H_6$ to the silane flow. The electron mobility of hydrogenated amorphous silicon is typically 1 $cm^2$/Vsec compared to 1300 $cm^2$/Vsec for crystalline silicon, and the n-type conductivity is typically $10^{-2}$ $cm^{-1}$ compared to $10^2$ $cm^{-1}$ for crystalline silicon. Thus, the minority carrier diffusion length is very small so that the depletion region forms most of the active carrier collecting volume of the cell (as compared to crystalline silicon where carriers could be photo-generated in the bulk and diffuse to the junction). An n-type layer 106, an i-type layer 108, and a p-type layer 102 is created.

Above p-layer 102, an indium tin oxide (ITO) layer 104, or another transparent conductor, would be deposited to form the top contact of set of diodes 100a–100c. The last layer of set of diodes 100a–100c is the ITO layer 104, which is a transparent conductor. This material is very easily degradable due to different environmental stresses and needs a protection layer. However, ITO layer 104, as well as a-Si:H cannot withstand high temperatures. Thus, the protection layer needs to have a low deposition temperature.

To produce sensor arrays that capture and provide signals in color (e.g., red, green, and blue-RGB), the present invention provides a protection layer that is shaped to form a binary optic element that discriminates the part of visible spectra not needed for each particular pixel. This is opposed to the traditional way of producing a color filter array, which is to fabricate different color filter materials (CFA) for RGB on top of the ITO layer. However, the traditional method adds three more process steps to the fabrication flow and also increases the complexity of the sensor creation process.

A binary optic element is shown in FIG. 1, formed by the use of echelon grating material and formed next to the protective layer 110. Protective layer 110 is designed for the DOT and acts as a protection layer from environmental stresses (humidity), as well as scratch protection. Binary optical elements 112 are used to discriminate the white light into color components that are to be captured by the system. In one embodiment, each binary optical element discriminates and passes through only one of the colors in the RGB color space.

In one embodiment, color discrimination may be achieved by taking advantage of the dispersion inherent to a diffraction grating—i.e., dispersion among the first order. Separation of color in the visible light spectrum has been investigated with both Bragg grating and echelon-type grating (both described "Color Separation by use of Binary Optics," Farn, M. W., Stren, M. B., Veldkamp W. B., and Medeiros, S. S. Opt. Lett. 18, p. 1214, 1993b). Beside the dispersive grating, a unique design based on an echelon-type grating can prove useful when grater control over the placement and intensity of the color is required.

Sol-gel glasses may be formed, for example, by hydrolysis of tetraethylorthosilicate (TEOS) and/or tetramethylorthosilicate (TMOS). After hydrolysis, these materials may be subjected to oxolation or oxygen bridge formation and polycondensation. The result is a silicon oxide complex that is solvent swollen to form a polymerized network. If a photoinitiator is included in the complex, the material may be shaped using conventional photoresist patterning techniques.

In accordance with one embodiment, a sol-gel hybrid glass can be prepared by hydrolysis polycondensation of the methacrylate group substituted silane in the presence of water. The gel synthesis happens, allowing the methylacryloxypropyl trimethoxysilane or glysidoxypropyltrimethylsilane precursor material to react with diluted acid or base water solution, for example, in a molar ratio of 1:2 respectively for several hours.

Before spin coating, propriety amounts of 1-hydroxycyclohexyl phenyl ketone may be added as a photoinitiator to initiate polymerization of unsaturated glass hybrid polymer.

The gel may be filtered by an 0.1 millimeter filter to remove aggregated polymer particles and to form a film with good surface quality. Films may then be then deposited on top of Diode on top to or on other substrates and pre-baked at 60° C. for 15 minutes. The resulting film thickness is adjustable by varying spinning speed and use of solvents such as methanol, ethanol or xylene.

The spin coated films may be cured by a mercury UV lamp or other light source through an opening in a photomask, for example, for 1 to 30 minutes to form patterns, as shown in FIG. 3. In particular, a UV mask may be situated over the hybrid sol-gel located over the substrate to create a graded exposure pattern in the sol-gel as indicated before. The patterned structure may be obtained by developing the sol-gel in isopropanol to remove unexposed parts of the sol-gel to form the lens, as shown in FIG. 1. After this removal step, the film may be postbaked at 100° to 200° C. for 10 to 60 minutes to harden the film.

The sol-gel formed into a plurality of discrete layers having distinct optical properties. Each layer or combination of layers may be formed during a different.

If particular material properties are necessary, titanium, silicon or zirconium, or the prehydrolysed alkoksides of these materials can be added to the solution of the methacrylate group substituted silanes. For example, titanium (IV)-propoxide and zirconium (IV)-propoxide may be used. Methacrylic acid may be used to prevent zirconium propoxide precipitation.

Figure 2:
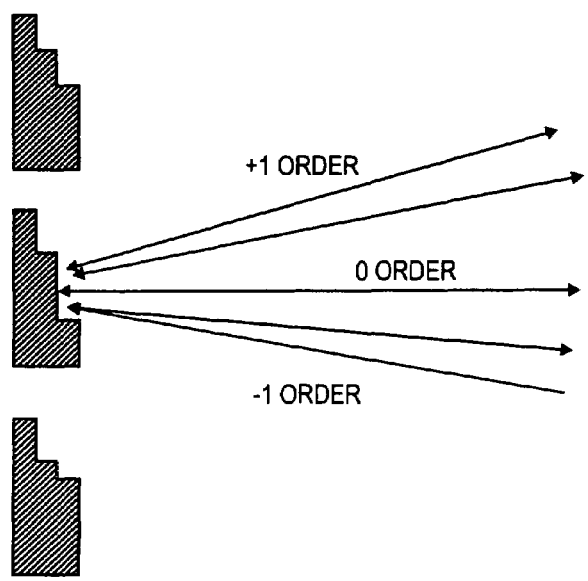
FIG. 2 is a diagram illustrating the effects of having a diffraction grating in the structure of FIG. 1.

To produce the lens shape shown in FIG. 2, a gray scale mask may be used. See Suleski, T. J. and Oshea, D. C. 1995, "Gray Scale Mask For Diffractive Optics Fabrication," Appl. Optics 34, 7507. A conventional mask material, which may be quartz or glass, is coated conventionally with chromium., In this way the sol-gel may be deposited and patterned at a temperature of less than 200° C.

FIG. 2 illustrates how grating allows the zero order of one wavelength to be transmitted, while the shorter and longer wavelengths are diffracted into −1 and 1 orders respectively. The phase step height of a conventional N-step blazed grating is $\lambda/N(n-1)$ while the echelon-type grating it is $\lambda/(n-1)$—or N times deeper. Visible echelon type grating designed for use in fused silica or different type of clear material has an etch depth of 1.14 to 2.28 µm. In one embodiment, a four step echelon is fabricated for full color production. This process also may include the gray level mask and allow the grating to be produced as only a one step photolithography.

Figure 3A:
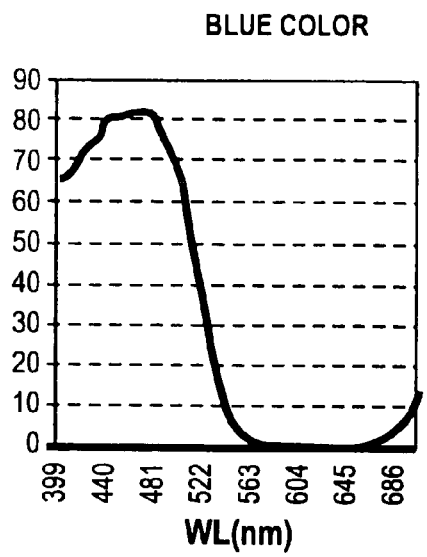
FIGS. 3a–3c are band-pass characteristics of grating elements configured in accordance with one embodiment of the present invention.
Figure 3B:
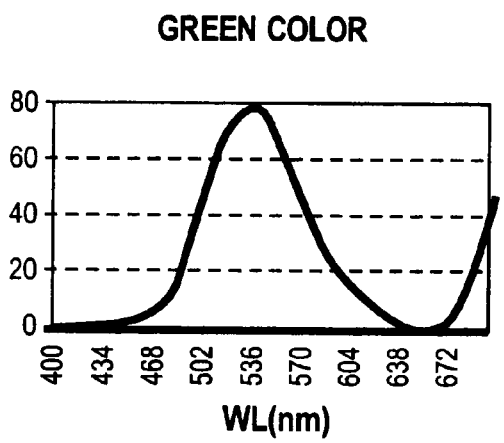
Figure 3C:
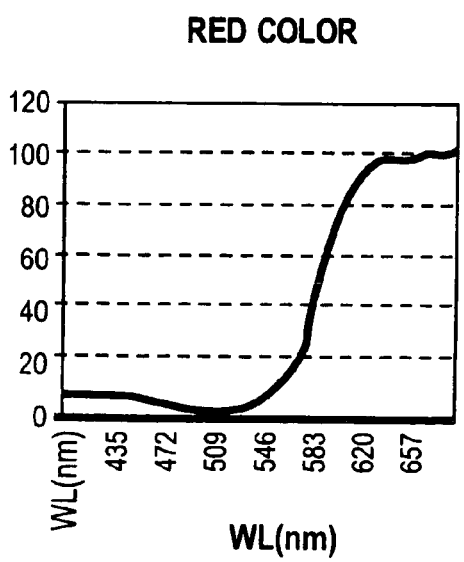

FIGS. 3a–c illustrate the band-pass characteristics of the grating elements configured in accordance with one embodiment of the present invention. FIG. 3a illustrates a blue grating element having a band-pass characteristic of 399–563 nanometers (nm). FIG. 3b illustrates a green grating element having a band-pass characteristic of 468–638 nm. FIG. 3c illustrates a red grating element having a band-pass characteristic from 569 nm and up.

The integration of optics, electronics and photonics components will play a large role in exponentially increasing sensor processing capability while reducing the cost of electro-optical systems. Binary optics provides a means for readily integrating micro-optics into these systems. Monolithic integrated focal plane array imaging micro-lenses provides high fill factors, facilitate reduced detector area, and reduce the cost of the product.

Figure 4:
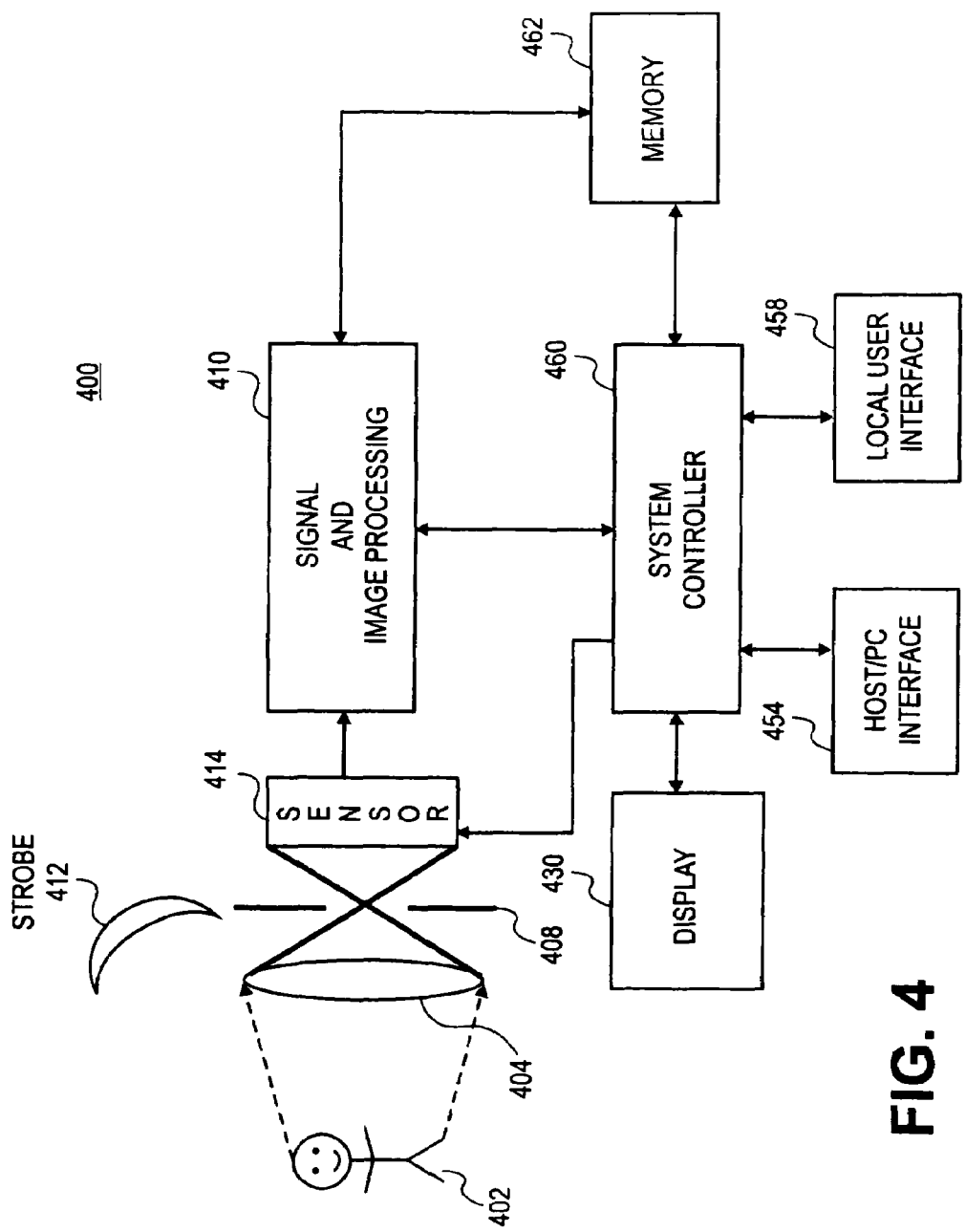
FIG. 4 is a block diagram of an imaging system configured in accordance with one embodiment of the present invention.

An embodiment of the invention included in an imaging system 400 is shown as a logical block diagram in FIG. 4. Imaging system 400 includes a number of conventional elements, such as an optical system having a lens 404 and aperture 408 that is exposed to the incident light reflected from a scene or object 402. The optical system properly channels the incident light towards a sensor array 414 containing light sensitive diodes having the integrated binary elements as shown in FIG. 1. Sensor array 414 generates sensor signals in response to an image of object 402 being formed on sensor array 414. The various control signals used in the operation of sensor array 414, such as a RESET signal, a SAMPLE signal and an ADDRESS signal is generated by a system controller 460. System controller 460 may include a microcontroller or a processor with input/output (I/O) interfaces that generates the control signals in response to instructions stored in a memory such as a memory 462. In one embodiment, memory 462, which stores code/program instructions and data includes both a non-volatile programmable memory component and a volatile memory component. System controller 460 also acts in response to user input via a local user interface 458 (as when a user pushes a button or turns a knob of system 400) or a host/PC interface 454 to manage the operation of imaging system 400. The functions of controller 460 may also be implemented as a logic circuit that is tailored to generate the control signals with proper timing. Host/PC interface 454 may also transfer the captured image data to an image processing and/or viewing system such as a computer separate from imaging system 400.

Imaging system 400 contains a display 430 for displaying the captured image data. In one embodiment, imaging system 400 is a portable digital camera with display 430 as a LCD for showing the captured image data.

To obtain images, a signal and image processing block 410 is provided in which hardware and software operates according to image processing methodologies to generate captured image data in response to receiving the sensor signals. The captured image data is then stored in memory 462. In addition to storing this image data in memory 462, optional storage devices (not shown) can be used aboard system 400 for storing the captured image data. Such local storage devices may include a removable memory card.

After the captured image data is stored in memory 462, the system operates as described above to process the captured image data to remove offset noises. In another embodiment, the captured image data may be processed to remove row offset noises after the image is transferred to a host computer. For example, where the imaging system is a tethered digital camera connected to a host computer, the processing may be performed by the host computer.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated pixel sensor structure comprising:
   a set of at least three light sensitive diodes, the set of at least three light sensitive diodes including an i-layer placed on top of an n-layer, a p-layer placed on top of the i-layer, and a transparent conductor placed on top of the p-layer;
   a protective layer coupled to the transparent conductor,
   a set of separated echelon diffraction grating elements for producing complementary colors and to protect the set of at least three light sensitive diodes, the protective layer disposed between adjacent echelon diffraction grating elements of the set of separated echelon diffraction grating elements, the set of grating elements are placed on top of the transparent conductor, wherein the protective layer is of a sol gel material, the protective layer covers a portion of the transparent conductor not covered by the set of separated echelon diffraction grating elements, and the integrated pixel sensor structure not including a lens.

2. The structure of claim 1, where the protective layer includes anti-reflection properties.

3. The structure of claim 1, where each light sensitive diode of the set of at least three light sensitive diodes is compatible with the protective layer and the protective layer is a material suitable for use with metal oxide semiconductor fabrication processes.

4. The structure of claim 1, where the set of separated echelon diffraction grating elements include a set of four step echelon grating elements.

5. A system comprising:
   an integrated pixel sensor structure having:
   a set of at least three light sensitive diodes, the at least three light sensitive diodes including an i-layer placed on top of an n-layer, and a p-layer placed on top of the i-layer;
   a protective layer coupled to a transparent conductor; and
   a set of echelon diffraction grating elements for producing complementary colors and to protect the set of at least three light sensitive diodes, the set of echelon diffraction grating elements placed above the transparent conductor, the protective layer disposed between adjacent echelon diffraction grating elements of the set of echelon diffraction grating elements; and
   a post capture signal processing unit coupled to the integrated pixel sensor, wherein the protective layer is of a sol gel material, the protective layer covers a portion of the transparent conductor not covered by the set of separated echelon diffraction grating elements, and the integrated pixel sensor structure not including a lens.

6. The system of claim 5, where the protective layer includes anti-reflection properties.

7. The system of claim 5, where the protective layer is suitable for fabrication processes that are compatible with each light sensitive diodes in the set of at least three light sensitive diodes.

8. The system of claim 5, where the set of echelon diffraction grating elements include a set of four step echelon grating elements.

9. A method comprising:
   providing a set of at least three light sensitive elements, the set of at least three light sensitive elements formed from placing an i-layer above an n-layer, placing a p-layer above the i-layer;
   placing a transparent conductor on top of the p-layer;
   placing a protective layer of a sol gel material on top of the transparent conductor, and
   forming a set of echelon diffraction grating elements for producing complementary colors, the protective layer disposed between adjacent echelon diffraction grating elements of the set of echelon diffraction grating elements, wherein the set of echelon diffraction grating elements to protect the set of at least three light sensitive elements, and the set of echelon diffraction grating elements are placed above the transparent conductor, and the protective layer covers a portion of the transparent conductor not covered by the set of echelon diffraction grating elements, and the set of at least three light sensitive elements not including a lens.

10. The method of claim 9, where placing the protective layer includes placing a material with anti-reflection properties above the transparent conductor.

11. The method of claim 9, where placing the protective layer includes placing a material suitable for fabrication processes that are compatible with each light sensitive element of the set of at least three light sensitive elements.

12. The method of claim 9, where the set of echelon diffraction grating elements include a set of four step echelon grating elements.

13. An integrated circuit die comprising:
- an image sensing area of the die having at least three light-sensitive diodes formed above a metalization layer of the die; and
- a protective layer of the die, wherein the protective layer is to protect each of the at least three diodes and a plurality of echelon diffraction gratings placed on top of a transparent conductor layer,
- the transparent conductor forms a top contact of the at least three light sensitive diodes and wherein the protective layer has a low enough deposition temperature so as not to environmentally stress the transparent conductor, and the protective layer covers a portion of the transparent layer not covered by the plurality of echelon diffraction gratings,
- wherein the protective layer is of a sol gel material, and the set of at least three light sensitive diodes not including a lens.

14. The integrated circuit die of claim 13 wherein the at least three diodes have amorphous silicon as their photoactive material.

15. The integrated circuit die of claim 14 wherein each of the at least three diodes has a n-i-p structure.

16. The integrated circuit die of claim 15 wherein each of the n and p portions of the n-i-p structure is thin relative to the i portion.

17. The integrated circuit die of claim 14 wherein the at least three diodes have a transparent conductor made of an indium tin oxide (ITO) layer that forms a top contact of the plurality of diodes.

18. The integrated circuit die of claim 13 wherein the protective layer has anti-reflective properties to act as an antireflective filter for the image sensing area of the die.

19. The integrated circuit die of claim 13 wherein the echelon diffraction grating is designed to impart RGB color sensing to the image sensing area of the die.

20. The integrated circuit die of claim 13 wherein the protective layer is made of a sol-gel material.

21. The integrated circuit die of claim 13 wherein the at least three diodes and the protective layer and compatible with a metal oxide semiconductor (MOS) fabrication process.

* * * * *

UNITED STATES PATENT AND TRADEMARK OFFICE
CERTIFICATE OF CORRECTION

PATENT NO. : 7,129,982 B1
APPLICATION NO. : 09/475487
DATED : October 31, 2006
INVENTOR(S) : Assadi It is certified that error appears in the above-identified patent and that said Letters Patent is hereby corrected as shown below:

In column 2, at line 35, after second occurrence "of" delete "micro optics".

In column 3, at line 38, after "described" insert --in--.

In column 4, at line 15, after "sol-gel" insert --may be--.

In column 4, at line 37, delete "A/(n-1)" insert --$\lambda$/(n-1)--.

Signed and Sealed this

Third Day of April, 2007

JON W. DUDAS
*Director of the United States Patent and Trademark Office*